(12) United States Patent
Lin et al.

(10) Patent No.: US 10,522,543 B2
(45) Date of Patent: Dec. 31, 2019

(54) METHOD FOR MANUFACTURING GATE STRUCTURE WITH ADDITIONAL OXIDE LAYER

(71) Applicant: TAIWAN SEMICONDUCTOR MANUFACTURING CO., LTD., Hsinchu (TW)

(72) Inventors: Chih-Wei Lin, Taichung (TW); Chih-Lin Wang, Zhubei (TW); Kang-Min Kuo, Zhubei (TW); Cheng-Wei Lian, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/055,526

(22) Filed: Aug. 6, 2018

(65) Prior Publication Data

US 2018/0342514 A1 Nov. 29, 2018

Related U.S. Application Data

(62) Division of application No. 14/689,859, filed on Apr. 17, 2015, now Pat. No. 10,043,802.

(51) Int. Cl.
*H01L 27/092* (2006.01)
*H01L 29/49* (2006.01)
(Continued)

(52) U.S. Cl.
CPC ...... *H01L 27/092* (2013.01); *H01L 21/28088* (2013.01); *H01L 29/401* (2013.01);
(Continued)

(58) Field of Classification Search
CPC ......... H01L 21/28088; H01L 21/28176; H01L 21/823842; H01L 27/092
See application file for complete search history.

(56) References Cited

U.S. PATENT DOCUMENTS

| 2010/0087055 A1 | 4/2010 | Lai et al. |
| 2010/0317181 A1 | 12/2010 | Chung et al. |

(Continued)

FOREIGN PATENT DOCUMENTS

| CN | 101950756 A | 1/2011 |
| TW | 201306261 A1 | 2/2013 |

*Primary Examiner* — Michael Carter
(74) *Attorney, Agent, or Firm* — Birch, Stewart, Kolasch & Birch, LLP (57) ABSTRACT

Methods for forming a semiconductor structure are provided. The method includes forming a first dummy gate structure and forming first spacers over a sidewall of the first dummy gate structure. The method includes removing the first dummy gate structure to form a first trench between the first spacers and forming a first capping layer in the first trench. A first portion of the first capping layer covers a sidewall of the first trench and a second portion of the first capping layer covers a bottom surface of the first trench. The method further includes oxidizing a sidewall of the first portion of the first capping layer and a top surface of the second portion of the first capping layer to form a first capping oxide layer and forming a first work function metal layer and forming a first gate electrode layer over the first work function metal layer.

20 Claims, 10 Drawing Sheets

(51) Int. Cl.
  *H01L 29/51* (2006.01)
  *H01L 29/40* (2006.01)
  *H01L 21/28* (2006.01)
  *H01L 29/423* (2006.01)
  *H01L 29/66* (2006.01)
  *H01L 21/8238* (2006.01)

(52) U.S. Cl.
  CPC .... *H01L 29/42364* (2013.01); *H01L 29/4966* (2013.01); *H01L 29/513* (2013.01); *H01L 29/517* (2013.01); *H01L 29/518* (2013.01); *H01L 29/66545* (2013.01); *H01L 21/28176* (2013.01); *H01L 21/823842* (2013.01); *H01L 29/6656* (2013.01)

(56) References Cited

U.S. PATENT DOCUMENTS

| | | |
|---|---|---|
| 2010/0326818 A1 | 12/2010 | Ikemoto et al. |
| 2011/0121399 A1* | 5/2011 | Park ................ H01L 21/823842 257/369 |
| 2011/0163449 A1 | 7/2011 | Kelly et al. |
| 2012/0264284 A1 | 10/2012 | Wang et al. |
| 2013/0154021 A1 | 6/2013 | Chuang et al. |
| 2013/0256805 A1 | 10/2013 | Chuang et al. |
| 2014/0035062 A1 | 2/2014 | Hooker et al. |
| 2014/0061817 A1 | 3/2014 | Gan et al. |
| 2014/0203373 A1 | 7/2014 | Chen et al. |

* cited by examiner

METHOD FOR MANUFACTURING GATE STRUCTURE WITH ADDITIONAL OXIDE LAYER

CROSS REFERENCE TO RELATED APPLICATIONS

This application is a Divisional application of U.S. patent application Ser. No. 14/689,859, filed on Apr. 17, 2015, the entire of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

However, although existing semiconductor manufacturing processes have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of semiconductor structures and methods for manufacturing the same are provided. The semiconductor structure includes a gate structure formed over a substrate, and the gate structure includes a gate dielectric layer, a capping layer formed over the gate dielectric layer, and a capping oxide layer formed over the capping layer in accordance with some embodiments. The capping oxide layer may be used as an oxygen source for the gate dielectric layer and as a barrier layer to prevent the metal formed over it from penetrating to the substrate.

Figure 1A:
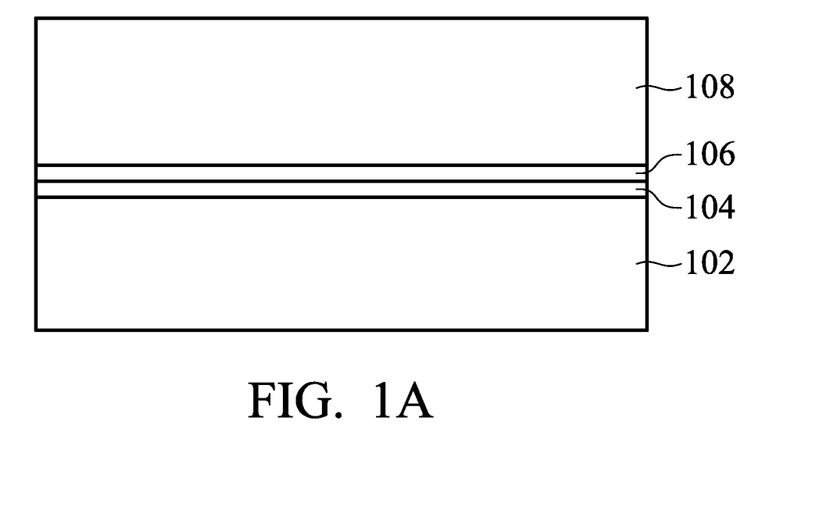
FIGS. 1A to 1G are cross-sectional representations of various stages of forming a semiconductor structure in accordance with some embodiments.

FIGS. 1A to 1G are cross-sectional representations of various stages of forming a semiconductor structure 100a in accordance with some embodiments. As shown in FIG. 1A, a substrate 102 is provided in accordance with some embodiments. Substrate 102 may be a semiconductor wafer such as a silicon wafer. Alternatively or additionally, substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

An interfacial layer 104, a dummy gate dielectric layer 106, a dummy gate electrode layer 108 are formed over substrate 102, as shown in FIG. 1A in accordance with some embodiments. In some embodiments, interfacial layer 104 is made of $SiO_2$. Interfacial layer 104 may be formed by performing an atomic layer deposition (ALD) process, thermal oxidation process, UV-Ozone oxidation process, or chemical vapor deposition (CVD) process.

Dummy gate dielectric layer 106 is formed over interfacial layer 104 and is made of high-k dielectric materials, such as metal oxide in accordance with some embodiments. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. Dummy gate dielectric layer 106 may be formed by chemical vapor deposition (CVD), physical vapor deposition, (PVD), atomic layer deposition (ALD), spin-on coating, or other applicable processes.

Figure 1B:
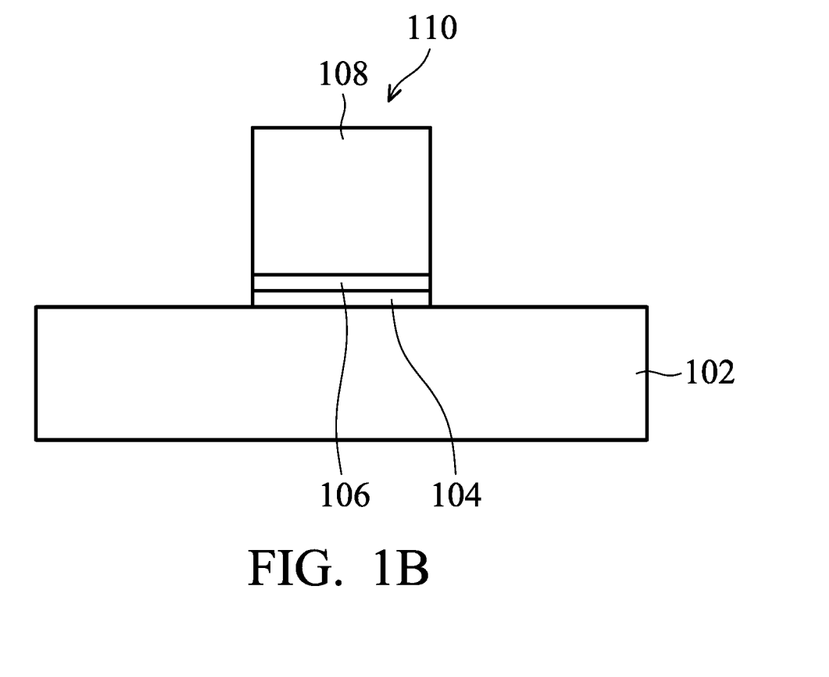

After dummy gate dielectric layer 106 is formed, dummy gate electrode layer 108 is formed over dummy gate dielectric layer 106 in accordance with some embodiments. In some embodiments, dummy gate electrode layer 108 is made of polysilicon. Next, interfacial layer 104, dummy gate dielectric layer 106, and dummy gate electrode layer 108 are patterned to form a dummy gate structure 110, as shown in FIG. 1B in accordance with some embodiments.

Figure 1C:
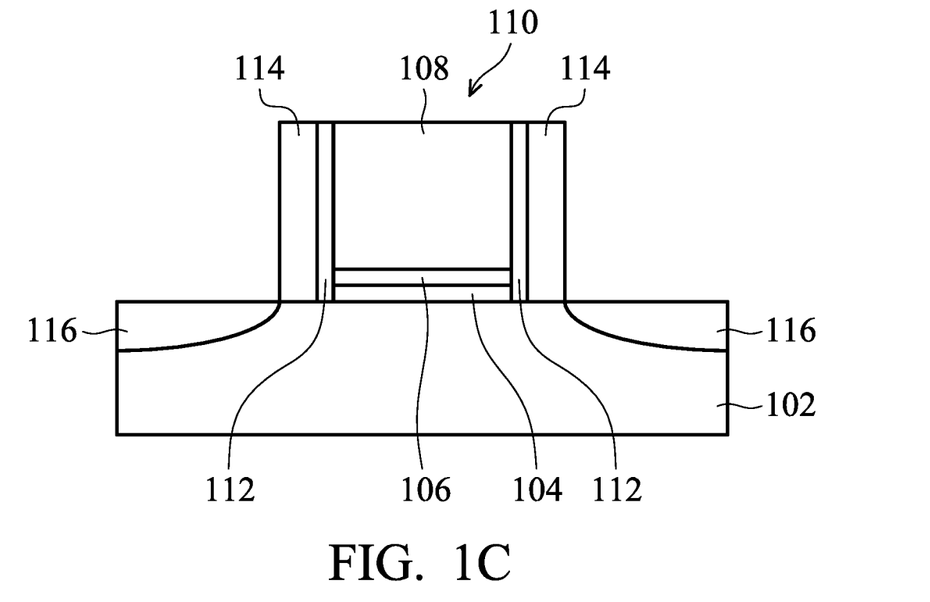

Afterwards, sealing layers 112 are formed on the sidewalls of dummy gate structure 110, as shown in FIG. 1C in accordance with some embodiments. Sealing layer 112 may protect dummy gate structure 110 from damage or loss during subsequent processing and may also prevent oxidation during subsequent processing. In some embodiments, sealing layer 112 is made of silicon nitride, silicon oxide, silicon oxynitride, silicon carbide, or other applicable dielectric materials. Sealing layer 112 may include a single layer or multiple layers.

Spacers 114 are further formed on sealing layer 112 in accordance with some embodiments. In some embodiments, spacers 114 are made of silicon nitride, silicon oxide, silicon carbide, silicon oxynitride, or other applicable materials.

Source/drain structures 116 are formed in substrate 102 adjacent to dummy gate structure 110, as shown in FIG. 1C in accordance with some embodiments. In some embodiments, source/drain structures 116 are formed by using an implantation process or an epitaxial (epi) process. In some embodiments, source/drain structures 116 include Ge, SiGe, InAs, InGaAs, InSb, GaAs, GaSb, InAlP, InP, or the like.

Figure 1D:
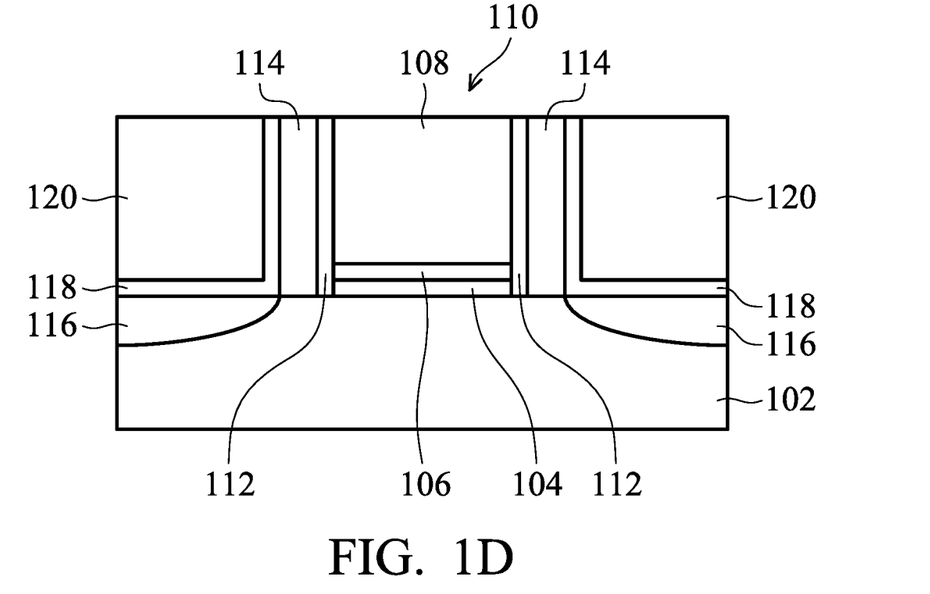

After source/drain structures 116 are formed in substrate 102, a contact etch stop layer (CESL) 118 is formed over substrate 102, and an interlayer dielectric layer 120 is formed over contact etch stop layer 118, as shown in FIG. 1D in accordance with some embodiments. As shown in FIG. 1D, contact etch stop layer 118 is formed on the sidewalls of spacers 114 and the top surface of source/drain structures 116 in accordance with some embodiments. In some embodiments, contact etch stop layer 118 is made of silicon nitride, silicon oxynitride, and/or other applicable materials. Contact etch stop layer 118 may be formed by chemical vapor deposition (CVD), physical vapor deposition, (PVD), atomic layer deposition (ALD), spin-on coating, or other applicable processes. In some embodiments, interlayer dielectric layer 120 is made of silicon oxide, silicon nitride, phosphosilicate glass (PSG), borophosphosilicate glass (BPSG), and/or other applicable dielectric materials. Interlayer dielectric layer 120 may be formed by chemical vapor deposition (CVD), physical vapor deposition, (PVD), atomic layer deposition (ALD), spin-on coating, or other applicable processes.

Figure 1E:
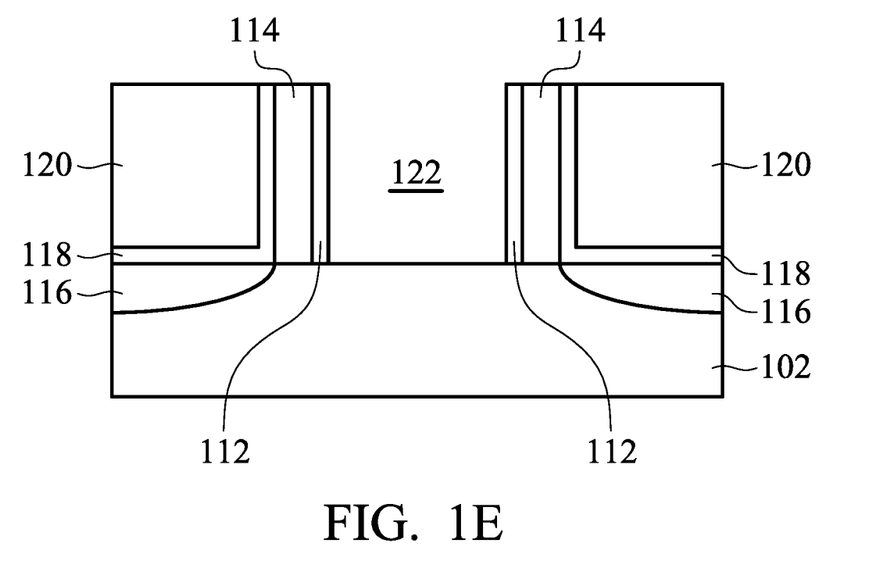

After interlayer dielectric layer 120 is formed, dummy gate structure 110 is removed to form a trench 122 between spacers 114, as shown in FIG. 1E in accordance with some embodiments. Afterwards, a metal gate structure 124 is formed in trench 122 in accordance with some embodiments.

Figure 1F:
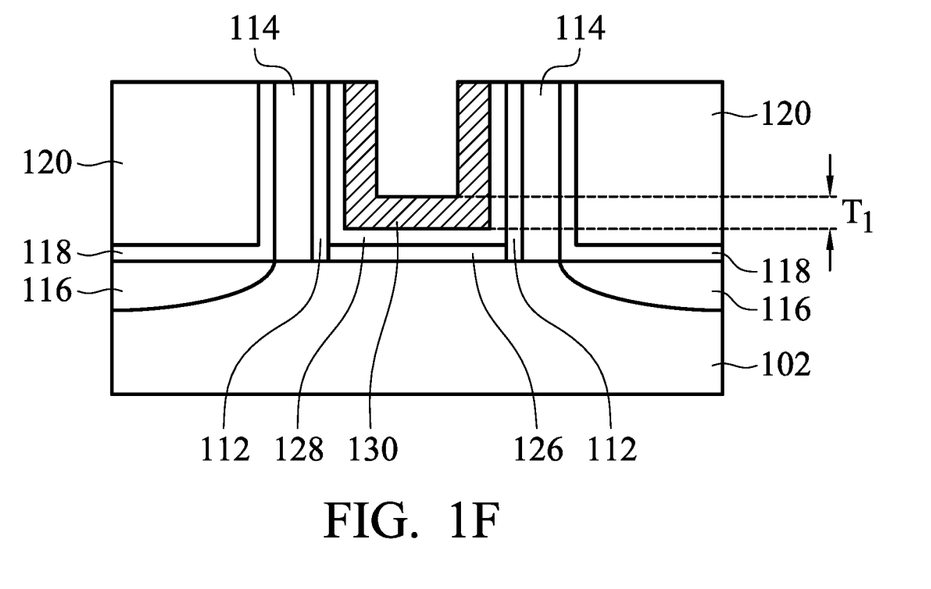

More specifically, metal gate structure 124 includes an interfacial layer 126, a gate dielectric layer 128, a capping layer 130, a capping oxide layer 132, a work functional metal layer 134, and a metal gate electrode layer 136 in accordance with some embodiments. As shown in FIG. 1F, interfacial layer 126 is formed over the top surface of substrate 102 which is exposed by trench 122. Interfacial layer 126 is formed between substrate 102 and gate dielectric layer 128, so that the adhesion of gate dielectric layer 128 can be improved. In some embodiments, interfacial layer 126 is made of $SiO_2$. In some embodiments, interfacial layer 126 has a thickness in a range from about 5 Å to about 20 Å. In some embodiments, interfacial layer 126 is formed by performing an atomic layer deposition (ALD) process, thermal oxidation process, UV-Ozone oxidation process, or chemical vapor deposition (CVD) process.

After interfacial layer 126 is formed, gate dielectric layer 128 is formed over interfacial layer 126, as shown in FIG. 1F in accordance with some embodiments. In some embodiments, gate dielectric layer 128 is made of a high k dielectric material, such as metal oxide. In some embodiments, gate dielectric layer 128 is made of hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, gate dielectric layer 128 has a thickness in a range from about 10 Å to about 30 Å. Gate dielectric layer 128 may be formed by chemical vapor deposition (CVD), physical vapor deposition, (PVD), atomic layer deposition (ALD), spin-on coating, or other applicable processes.

After gate dielectric layer 128 is formed, capping layer 130 is formed over gate dielectric layer 128, as shown in FIG. 1F in accordance with some embodiments. Capping layer 130 is configured to prevent the metal formed over it from penetrating into the channel region in substrate 102 below metal gate structure 124. In some embodiments, capping layer 130 has a thickness $T_1$ in a range from about 5 Å to about 100 Å. If capping layer 130 is not thick enough, the metal formed over capping layer 130 may still penetrate through it and enter into substrate 102. On the other hand, if capping layer 130 is too thick, too much oxygen in gate dielectric layer 128 may be drawn by capping layer 130, resulting in a great amount of oxygen vacancy in gate dielectric layer 128.

In some embodiments, capping layer 130 is made of metal nitride. Examples of materials used to form capping layer 130 may include, but are not limited to, TiN, TaN, and WN. Capping layer 130 may be formed by chemical vapor deposition (CVD), physical vapor deposition, (PVD), atomic layer deposition (ALD), spin-on coating, or other applicable processes. In some embodiments, capping layer 130 is formed by performing a thermal CVD process at a temperature in a range from about 200° C. to about 500° C. If the temperature of the process is too high, the resistance of the resulting capping layer 130 may be increased.

Figure 1G:
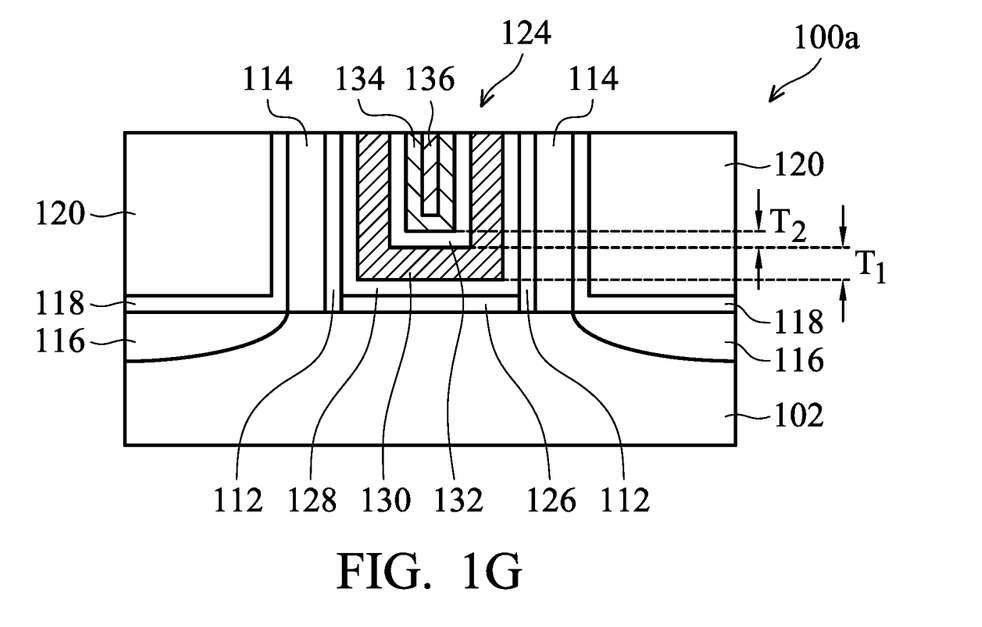

After capping layer 130 is formed, a capping oxide layer 132 is formed over capping layer 130, as shown in FIG. 1G in accordance with some embodiments. Capping oxide layer 132 is formed over capping layer 130 to further insure that the metal formed thereover will not penetrate (e.g. diffuse) into substrate 102. That is, capping oxide layer 132 is also configured to prevent the metal from penetrating or diffusing into substrate 102.

In some embodiments, capping oxide layer 132 is made of metal oxynitride. In some embodiments, capping oxide layer 132 is made of $MN_xO_y$, and M is Ti, Ta, or W, N is nitrogen, O is oxygen, x is in a range from about 4 to about 9, y is in a range from about 5 to about 9. In some embodiments, a ratio of x to y is in a range of about 0.4 to about 1.8. If the ratio of x to y is too large, there may not be enough oxygen to prevent the metal formed thereon from penetrating. On the other hand, if the ratio of x to y is too small, it may contain too much oxygen resulting in the regrowth of the interfacial layer. In some embodiments, capping oxide layer 130 is made of TiN, and capping oxide layer 132 is made of $TiN_xO_y$.

In some embodiments, capping oxide layer 132 is made of $TiO_y$. In some embodiments, y is in a range from about 5 to about 9.

In some embodiments, capping oxide layer 132 is formed by oxidizing capping layer 130. In some embodiments, capping oxide layer 132 is formed by performing an annealing process. In some embodiments, capping oxide layer 132 is formed by oxidizing capping layer 130 at a temperature in a range from about 600° C. to about 1000° C. As described previously, capping oxide layer 132 is configured to prevent the metal formed over it from diffusing through. Therefore, if the temperature for forming capping oxide layer 132 is not high enough, the resulting capping oxide layer 132 may not be thick enough to stop the metal. On the other hand, if the temperature for forming capping oxide layer 132 is too high, the resulting capping oxide layer 132 may be too thick, resulting in undermining the performance of metal gate structure 124. In addition, interfacial layer 126 may also become thicker and the gate dielectric layer 128 may be crystallized due to the high temperature.

In some embodiments, capping oxide layer 132 has a thickness $T_2$ in a range from about 1 Å to about 50 Å. Since oxide is a relatively rigid material, capping oxide layer 132 does not need to be very thick to block the metal from penetrating into it. However, if capping oxide layer 132 is too thin, it may not be able to stop the metal completely. On the other hand, if capping oxide layer 132 is too thick, the capacitance of the resulting metal gate structure 124 may be increased and its performance may therefore be undermined.

In some embodiments, the thickness $T_1$ of capping layer 130 is greater than the thickness $T_2$ of capping oxide layer 132. In some embodiments, the sum of thickness $T_1$ of capping layer 130 and thickness $T_2$ of capping oxide layer 132 is in a range from about 6 Å to about 150 Å. As described previously, since capping layer 130 and capping oxide layer 132 are configured to block the metal formed over them from penetrating through, capping layer 130 and capping oxide layer 132 should be thick enough. However, if capping layer 130 and capping oxide layer 132 are too thick, the performance of the resulting metal gate structure 124 may be undermined.

After capping oxide layer 132 is formed, work function metal layer 134 is formed over capping oxide layer 132, and metal gate electrode layer 136 is formed over work function metal layer 134, as shown in FIG. 1G in accordance with some embodiments. Work function metal layer 134 is tuned to have a proper work function. In some embodiments, work function metal layer 134 is made of metal nitride. For example, if a P-type work function metal (P-metal) for a PMOS device is desired, TiN, WN, or W may be used. On the other hand, if an N-type work function metal (N-metal) for NMOS devices is desired, TiAl, TiAlN, or TaCN, may be used.

In some embodiments, metal gate electrode layer 136 is made of a conductive material, such as a metal. Examples of the conductive materials used to form metal gate electrode 136 may include, but are not limited to, aluminum, copper, tungsten, titanium, tantalum, or other applicable materials. As described previously, in subsequent processes, the metal of metal gate electrode layer 136 may diffuse toward the layers formed below. However, since capping layer 130 and capping oxide layer 132 are formed below metal gate electrode layer 136, the metal of metal gate electrode layer 136 can be blocked by them and will not penetrate through gate dielectric layer 128 and enter into substrate 102.

FIGS. 2A to 2I are cross-sectional representations of various stages of forming a semiconductor structure 100b in accordance with some embodiments. Although the sequence of forming each element in semiconductor structure 100b may be different from that in semiconductor structure 100a shown in FIGS. 1A to 1G and described previously, the materials and processes being used are similar or the same. Therefore, those materials and processes are not repeated herein.

Figure 2A:
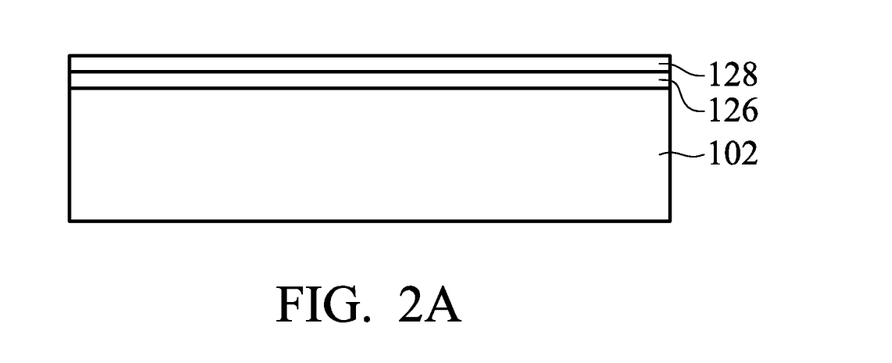
FIGS. 2A to 2I are cross-sectional representations of various stages of forming a semiconductor structure in accordance with some embodiments.

As shown in FIG. 2A, interfacial layer 126 is formed over substrate 102, and gate dielectric layer 128 is formed over interfacial layer 126 in accordance with some embodiments. As described previously, interfacial layer 126 is formed between substrate 102 and gate dielectric layer 128, so that the adhesion of gate dielectric layer 128 can be improved.

Figure 2B:
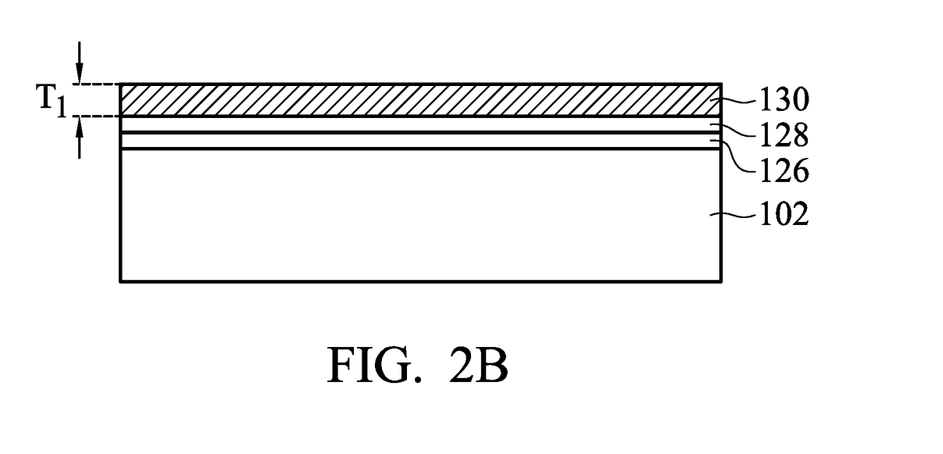

After gate dielectric layer 128 is formed, capping layer 130 is formed over gate dielectric layer 128, as shown in FIG. 2B in accordance with some embodiments. As described previously, capping layer 130 is configured to prevent the metal formed over it from penetrating into substrate 102. In some embodiments, the thickness $T_1$ of capping layer 130 is in a range from about 10 Å to about 50 Å.

Figure 2C:
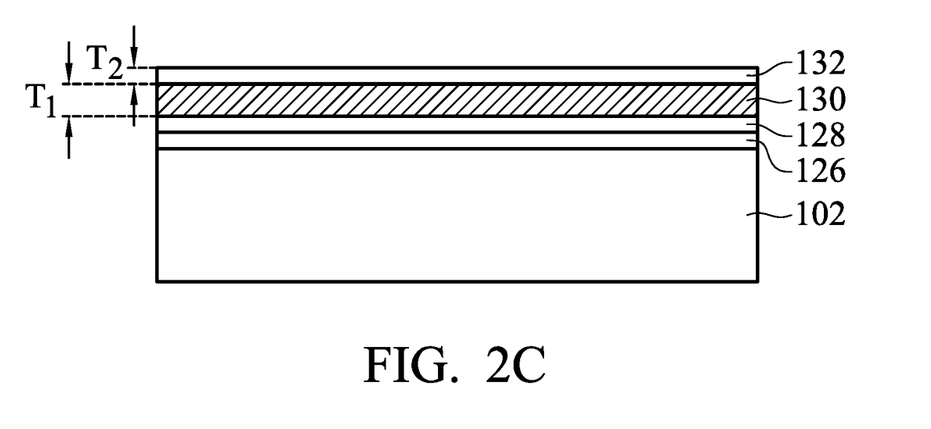

After capping layer 130 is formed, capping oxide layer 132 is formed over capping layer 130, as shown in FIG. 2C in accordance with some embodiments. As described previously, capping oxide layer 132 is configured to prevent the metal formed over it from diffusing into substrate 102. In some embodiments, capping oxide layer 132 has a thickness $T_2$ in a range from about 5 Å to about 10 Å.

Figure 2D:
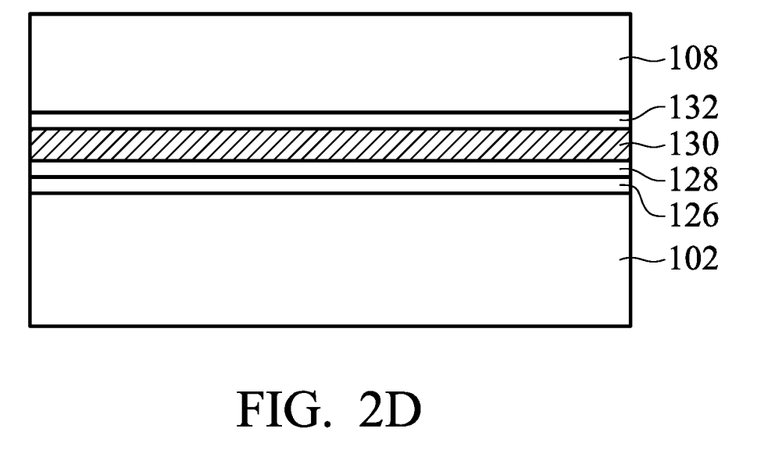
Figure 2E:
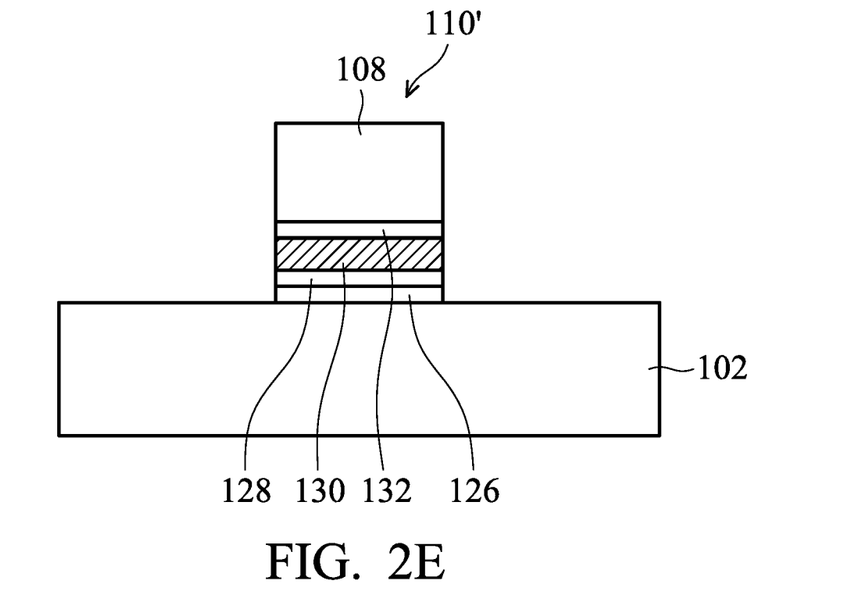

After capping oxide layer 132 is formed, dummy gate electrode layer 108 is formed over capping oxide layer 132, as shown in FIG. 2D in accordance with some embodiments. Afterwards, dummy gate electrode layer 108, capping oxide layer 132, capping layer 130, gate dielectric layer 128, and interfacial layer 126 are patterned to form a dummy gate structure 110', as shown in FIG. 2E in accordance with some embodiments.

Figure 2F:
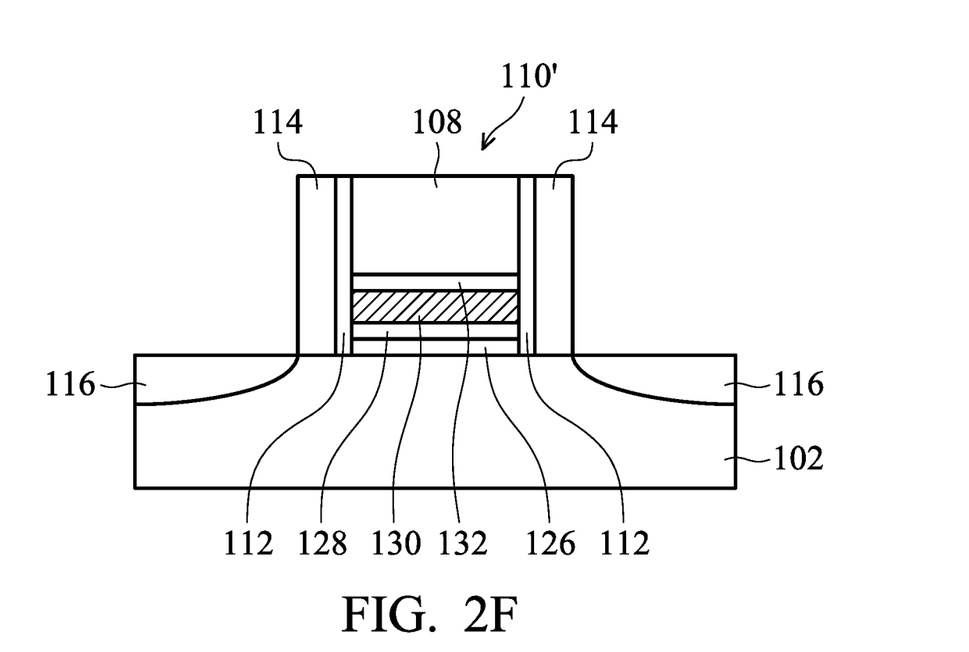

After dummy gate structure 110' is formed, sealing layers 112 are formed over the sidewalls of dummy gate structure 110', and spacers 114 are formed over sealing layers 112, as shown in FIG. 2F in accordance with some embodiments. In addition, source/drain structures 116 are formed adjacent to dummy gate structure 110' in substrate 102.

Figure 2G:
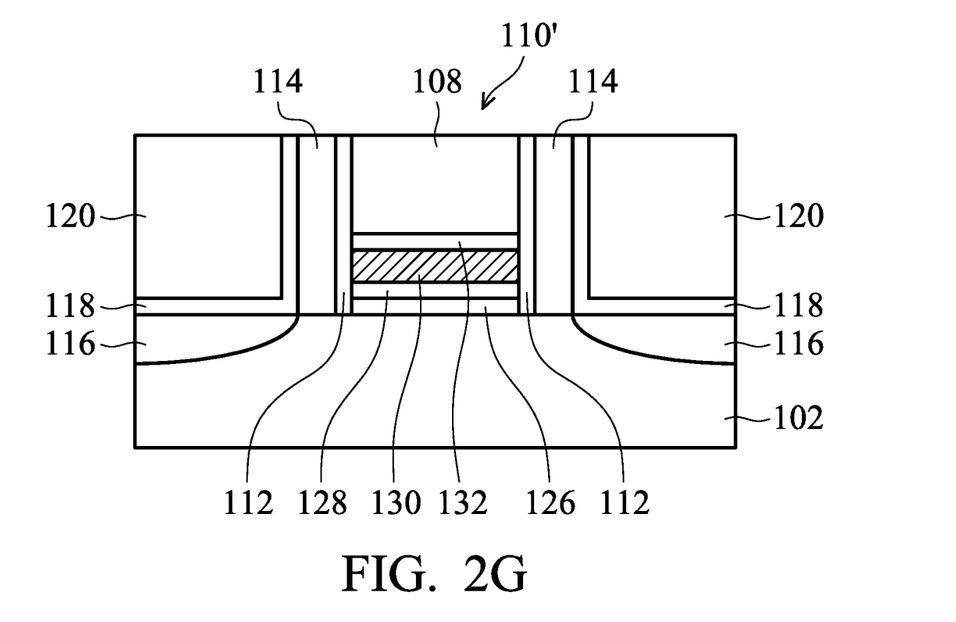
Figure 2H:
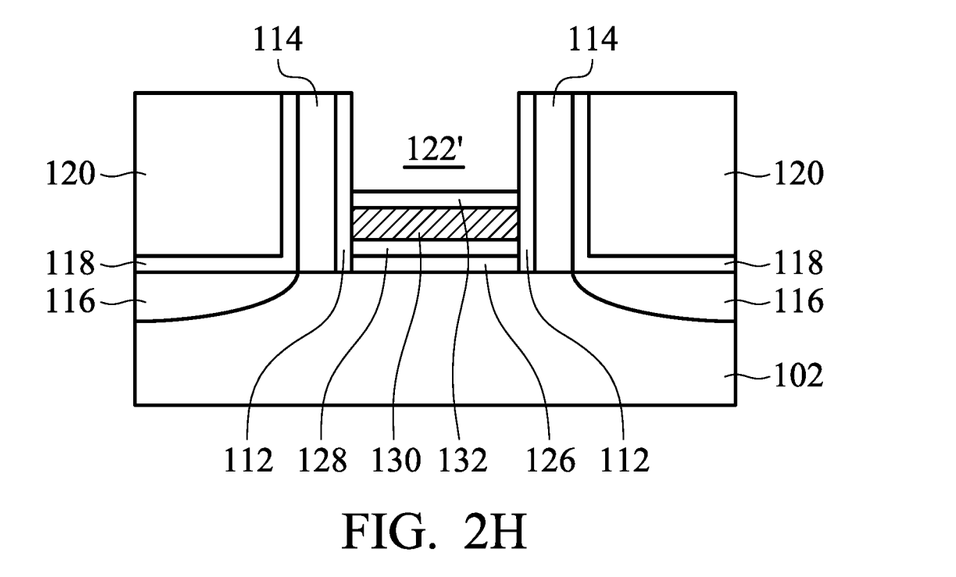

Next, contact etch stop layer 118 is formed over substrate 102, and interlayer dielectric layer 120 is formed over contact etch stop layer 118, as shown in FIG. 2G in accordance with some embodiments. Afterwards, dummy gate electrode layer 108 is removed to form trench 122' between spacers 114, as shown in FIG. 2H in accordance with some embodiments.

Figure 2I:
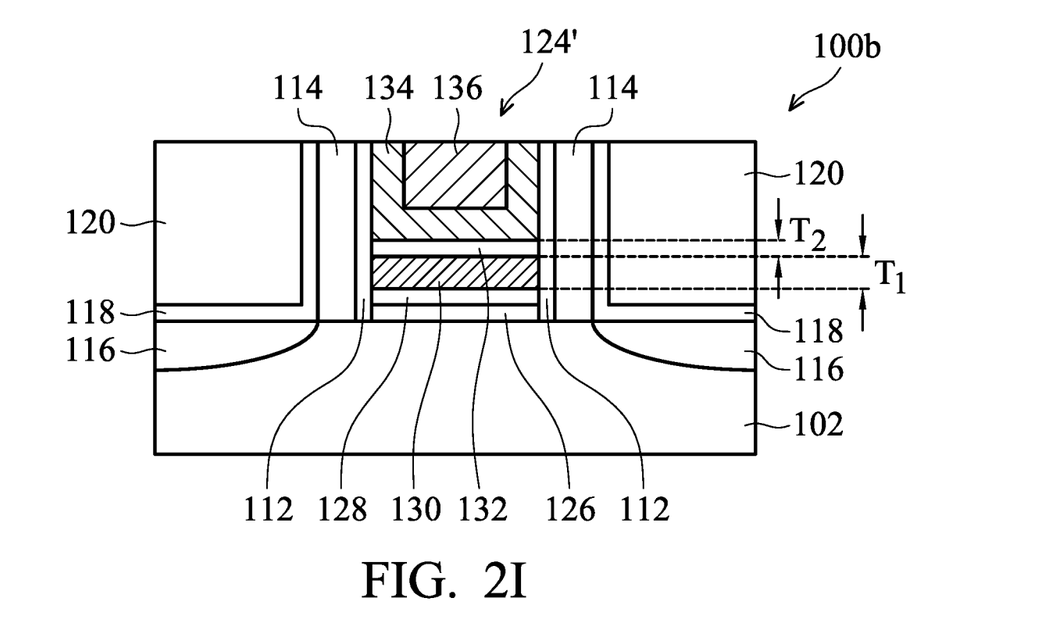

After trench 122' is formed, work function metal layer 134 is formed in trench 122', and metal gate electrode layer 136 is formed over work function metal layer 134, as shown in FIG. 2I in accordance with some embodiments. As shown in FIG. 2I, semiconductor structure 100b includes a metal gate structure 124', which further includes interfacial layer 126, gate dielectric layer 128, capping layer 130, capping oxide layer 132, work functional layer 134, and metal gate electrode layer 136. In addition, interfacial layer 126, gate dielectric layer 128, capping layer 130, and capping oxide layer 132 in metal gate structure 124' are formed before dummy gate electrode layer 108 is formed in accordance with some embodiments. That is, gate dielectric layer 128, capping layer 130, and capping oxide layer 132 may be formed after or before dummy gate electrode layer 108 is removed, as shown in FIGS. 1A to 1G and FIGS. 2A to 2I, and the scope of the disclosure is not intended to be limited.

Figure 3:
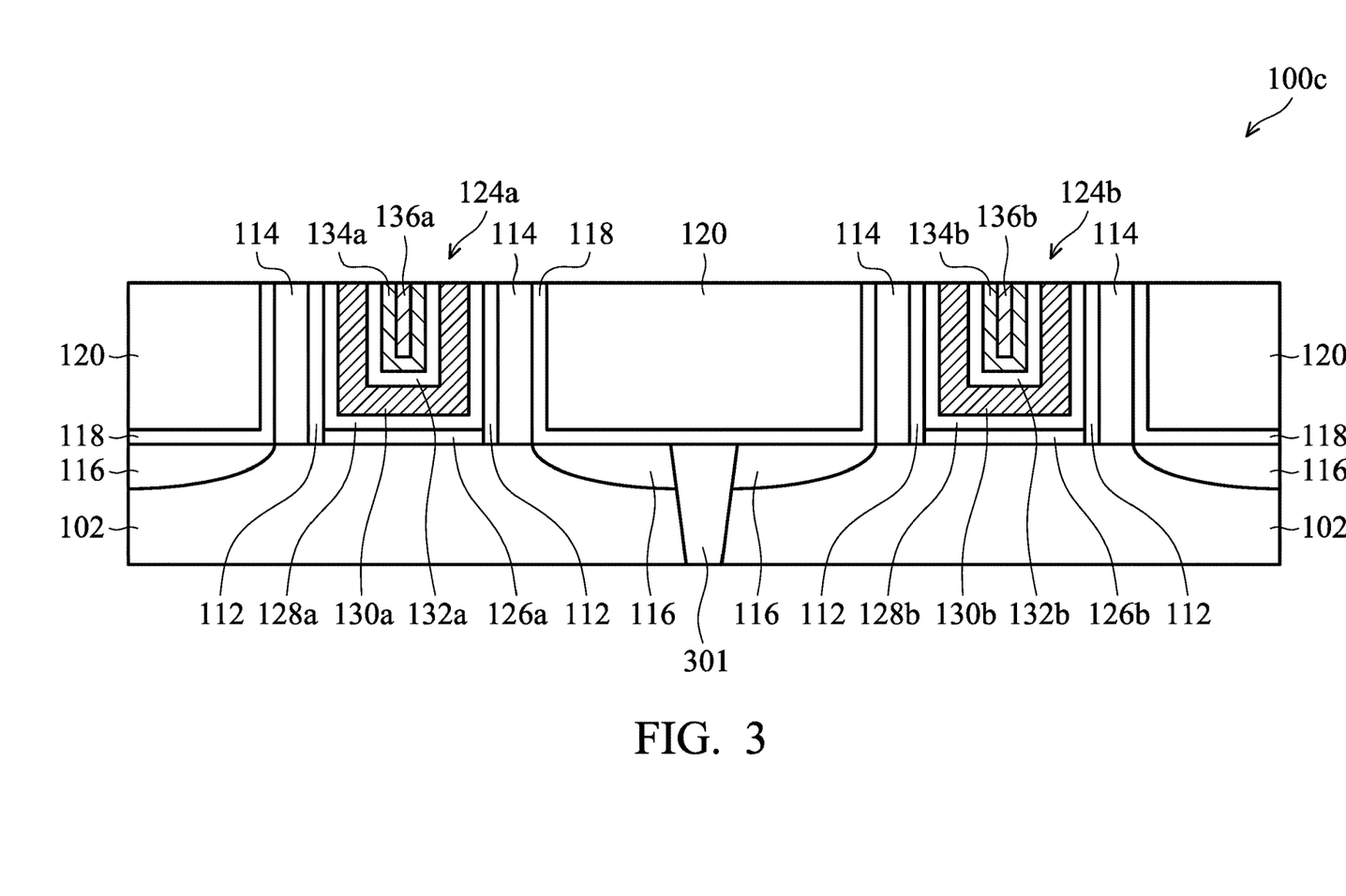
FIG. 3 is a cross-sectional representation of a semiconductor structure 100c in accordance with some embodiments.

FIG. 3 is a cross-sectional representation of a semiconductor structure 100c in accordance with some embodiments. Semiconductor structure 100c includes a first metal gate structure 124a and a second metal gate structure 124b formed over substrate 102, and first metal gate structure 124a and second metal gate structure 124b are separated by an isolation structure 301 in accordance with some embodiments.

As shown in FIG. 3, first metal gate structure 124a includes a first interfacial layer 126a, a first gate dielectric layer 128a, a first capping layer 130a, a first capping oxide layer 132a, a first work function metal layer 134a, and a first metal gate electrode layer 136a in accordance with some embodiments. First interfacial layer 126a is formed on the top surface of substrate 102 and may be formed by the materials and processes used to form interfacial layer 126 described previously. First gate dielectric layer 128a is formed on first interfacial layer 126a and may be formed by the materials and processes used to form gate dielectric layer 128 described previously.

First capping layer 130a is formed on first gate dielectric layer 128a and may be formed by the materials and processes used to form capping layer 130 described previously. First capping oxide layer 132a is formed on first capping layer 130a and may be formed by the materials and processes used to form capping oxide layer 132 described previously. First work function metal layer 134a is formed on first capping oxide layer 132a and may be formed by the materials and processes used to form work function metal layer 134 described previously. First metal gate electrode layer 136a is formed on first work function metal layer 134a and may be formed by the materials and processes used to form metal gate electrode layer 136 described previously.

In addition, second metal gate structure 124b includes a second interfacial layer 126b, a second gate dielectric layer 128b, a second capping layer 130b, a second capping oxide layer 132b, a second work function metal layer 134b, and a second metal gate electrode layer 136b in accordance with some embodiments. Second interfacial layer 126b is formed on the top surface of substrate 102 and may be formed by the materials and processes used to form interfacial layer 126 described previously. Second gate dielectric layer 128b is formed on second interfacial layer 126b and may be formed by the materials and processes used to form gate dielectric layer 128 described previously.

Second capping layer 130b is formed on second gate dielectric layer 128b and may be formed by the materials and processes used to form capping layer 130 described previously. Second capping oxide layer 132b is formed on second capping layer 130b and may be formed by the materials and processes used to form capping oxide layer 132 described previously. Second work function metal layer 134b is formed on second capping oxide layer 132b and may be formed by the materials and processes used to form work function metal layer 134 described previously. Second metal gate electrode layer 136b is formed on second work function metal layer 134b and may be formed by the materials and processes used to form metal gate electrode layer 136 described previously.

Furthermore, sealing layers 112 are formed on the sidewalls of first metal gate structure 124a and second metal gate structure 124b, and spacers 114 are formed over sealing layer 112 in accordance with some embodiments. In addition, source/drain structures 116 are formed adjacent to first metal gate structure 124a and second metal gate structure 124b in substrate 102. Contact etch stop layer 118 is formed on the sidewalls of spacers 114 and over source/drain structures 116 over substrate 102, and interlayer dielectric layer 120 is formed over contact etch stop layer 118.

In some embodiments, first metal gate structure 124a is used in a p-type metal-oxide-semiconductor (PMOS) transistor and second metal gate structure 124b is used in an n-type metal-oxide-semiconductor (NMOS) transistor. In addition, first work function metal layer 134a and second work function metal layer 134b may be used to control the electrical type of transistors. Accordingly, first work function metal layer 134a and second work function metal layer 134b are made of different materials in accordance with some embodiments. For example, first work function metal layer 134a is made of a P-type metal, such as TiN, WN, or W, and second work function metal layer 134b is made of an N-type metal, such as TiAl, TiAlN, or TaCN.

In some embodiments, first capping layer 130a and second capping layer 130b are made of the same material and first capping oxide layer 132a and second capping oxide layer are made of the same material. As described previously, first capping layer 130a, second capping layer 130b, first capping oxide layer 132a, and second capping oxide layer 132b are configured to prevent the metal formed over them (e.g. the metal in first metal gate electrode layer 136a and second metal gate electrode layer 136b) from diffusing into substrate 102. That is, the electrical type of transistors are not controlled by the materials used to form first capping layer 130a, second capping layer 130b, first capping oxide layer 132a, and second capping oxide layer 132b.

Accordingly, even if first metal gate structure 124a is used in a PMOS transistor and second metal gate structure 124b is used in an NMOS transistor, the material used to form first capping layer 130a and second capping layer 130b may still be the same. In some embodiments, first capping layer 130a and second capping layer 130b are made of metal nitride, and first capping oxide layer 132a and second capping oxide layer 132b are made of metal oxynitride.

In some embodiments, first capping layer 130a and first work function metal layer 134a are made of the same material, and second capping layer 130b and second work function metal layer 134b are made of different materials. In some embodiments, first capping layer 130a and second capping layer 130b are respectively thicker than first capping oxide layer 132a and second capping oxide layer 132b. In some embodiments, first capping oxide layer 132a and second capping oxide layer 132b have equal thickness in a range from about 5 Å to about 10 Å. In some embodiments, the sum of the thicknesses of first capping layer 130a and first capping oxide layer 132a is equal to the sum of the thicknesses of second capping layer 130b and second capping oxide layer 132b and is in a range from about 15 Å to about 60 Å.

As shown in FIGS. 1A to 3 and described previously, capping oxide layer 132 (or capping oxide layer 132a or 132b) is formed over capping layer 130 (or capping layer 130a or 130b). Capping oxide layer 132 is configured to act as an oxygen source for gate dielectric layer 128 formed below and to prevent the metal formed over it from diffusing into substrate 102.

More specifically, gate dielectric layer 128 tends to lose its oxygen during subsequent manufacturing processes, resulting in forming oxygen vacancies in gate dielectric layer 128. The oxygen vacancy in gate dielectric layer 128 may lead to high threshold voltage of the semiconductor structure, and the resulting devices may have poor uniformity. However, when capping oxide layer 132 is formed on capping layer 130 over gate dielectric layer 128, capping oxide layer 132 may be seen as an oxygen source to provide oxygen to gate dielectric layer 128. Therefore, the oxygen vacancy in gate dielectric layer 128 can be reduced and the uniformity of the resulting devices, including semiconductor structures 100a, 100b, and 100c, can be improved.

Furthermore, a channel is formed in substrate 102 below metal gate structure 124 (or metal gate structure 124', 124a, or 124b). The metal formed over the channel, such as the metal in gate electrode layer 136, tend to penetrate through the gate structure and enter into the channel. In this case, substrate spiking occurs, and the performance of the channel may be reduced. However, since capping oxide layer 132 is formed over capping layer 130, capping oxide layer 132 can be used as a barrier to block the metal over it. That is, capping oxide layer 132 may prevent the metal formed over it from diffusing through it. Since the metal formed over substrate 102 cannot penetrate gate dielectric layer 128 and enter into substrate 102, the performance of semiconductor structure 100a (or semiconductor structures 100b and 100c) can be improved.

In addition, since capping oxide layer 132 is formed over capping layer 130 and is more rigid than capping layer 130, the thickness of capping layer 130 does not have to be very thick to block the metal. If capping layer 130 is too thick, it may also tend to draw the oxygen in gate dielectric layer 128 and the threshold voltage of the semiconductor structure may therefore increase. However, in the embodiments described above, capping oxide layer 132 is used to help capping layer 130 to block the metal over it. Therefore, capping layer 130 can be relatively thin. That is, by forming both capping layer 130 and capping oxide layer 132, the metal penetration can be prevented without resulting in the increase of the threshold voltage.

Moreover, capping oxide layer 132 is formed over capping layer 130, instead directly formed over gate dielectric layer 128. If an oxide layer, such as a $TiN_xO_y$ layer, is formed directly over gate dielectric layer 128, the k value of the semiconductor structure may be increased, and the performance of the semiconductor structure may be reduced. However, in the embodiments described above, capping oxide layer 132 is formed over capping layer 130. Accordingly, the k value of gate dielectric layer 128 will not be affected, and the performance of semiconductor structure 100a is not undermined.

Embodiments of semiconductor structures and methods for manufacturing the same are provided. The semiconductor structure includes a gate structure, and the gate structure includes a gate dielectric layer, a capping layer, a capping oxide layer, a work function metal layer, and a gate electrode layer. The capping oxide layer is formed over the capping layer to prevent the metal formed over it, such as the metal in the gate electrode layer, from penetrating the gate dielectric layer and entering the substrate below the gate structure. In addition, the capping oxide layer may also be used as an oxygen source to reduce the oxygen vacancy in the gate dielectric layer. Therefore, the performance of the semiconductor structure can be improved.

In some embodiments, a method for manufacturing a semiconductor structure is provided. The method for manufacturing a semiconductor structure includes forming a first dummy gate structure over a substrate and forming first spacers over a sidewall of the first dummy gate structure. The method for manufacturing a semiconductor structure includes removing the first dummy gate structure to form a first trench between the first spacers and forming a first capping layer in the first trench. In addition, a first portion of the first capping layer covers a sidewall of the first trench and a second portion of the first capping layer covers a bottom surface of the first trench. The method for manufacturing a semiconductor structure further includes oxidizing a sidewall of the first portion of the first capping layer and a top surface of the second portion of the first capping layer to form a first capping oxide layer and forming a first work function metal layer over the first capping oxide layer. The method for manufacturing a semiconductor structure further includes forming a first gate electrode layer over the first work function metal layer.

In some embodiments, a method for manufacturing a semiconductor structure is provided. The method for manufacturing a semiconductor structure includes forming a first gate dielectric layer over a substrate and forming a first capping layer over the first gate dielectric layer. The method for manufacturing a semiconductor structure includes annealing the first capping layer to form a first capping oxide layer and forming a first work function metal layer over the first capping oxide layer. The method for manufacturing a semiconductor structure further includes forming a first gate electrode layer over the first work function metal layer. In addition, a thickness of the first capping layer is greater than a thickness of the first capping oxide layer.

In some embodiments, a method for manufacturing a semiconductor structure is provided. The method for manufacturing a semiconductor structure includes forming a first gate dielectric layer and a second gate dielectric layer over a substrate and forming a first capping layer and a second capping layer over the first gate dielectric layer and the second gate dielectric layer respectively. The method for manufacturing a semiconductor structure includes annealing the first capping layer and the second capping layer to form a first capping oxide layer over the first capping layer and a second capping oxide layer over the second capping layer and forming a first work function metal layer over the first capping oxide layer and a second work function metal layer over the second capping oxide layer. In addition, the first capping layer and the second capping layer are made of a same material, the first work function metal layer is made of a P-type metal, and the second work functional metal layer is made of a N-type metal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
    forming a first dummy gate structure over a substrate;
    forming first spacers over sidewalls of the first dummy gate structure;
    removing the first dummy gate structure to form a first trench between the first spacers;
    forming a first capping layer in the first trench, wherein a first portion of the first capping layer covers a sidewall of the first trench and a second portion of the first capping layer covers a bottom surface of the first trench;
    oxidizing a sidewall of the first portion of the first capping layer and a top surface of the second portion of the first capping layer to form a first capping oxide layer;
    forming a first work function metal layer over the first capping oxide layer; and
    forming a first gate electrode layer over the first work function metal layer.

2. The method for manufacturing a semiconductor structure as claimed in claim 1, wherein the first capping layer is made of TiN, and the first capping oxide layer is made of TiNxOy, and x:y is in a range from about 0.4 to about 1.8.

3. The method for manufacturing a semiconductor structure as claimed in claim 1, wherein the first capping layer is heated at a temperature in a range from about 600° C. to about 1000° C. to form the capping oxide layer.

4. The method for manufacturing a semiconductor structure as claimed in claim 1, wherein a thickness of the first capping layer is greater than a thickness of the first capping oxide layer, and a sum of the thickness of the first capping layer and the thickness of the first capping oxide layer is in a range from about 6 Å to about 150 Å.

5. The method for manufacturing a semiconductor structure as claimed in claim 1, further comprising:
forming a gate dielectric layer on the sidewall of the first trench and the bottom surface of the first trench before the first capping layer is formed,
wherein the gate dielectric layer surrounds the first portion and the second portion of the first capping layer.

6. The method for manufacturing a semiconductor structure as claimed in claim 1, further comprising:
forming a second dummy gate structure over the substrate;
forming second spacers over sidewalls of the second dummy gate structure;
removing the second dummy gate structure to form a second trench between the second spacers;
forming a second capping layer in the second trench, wherein a first portion of the second capping layer covers a sidewall of the second trench and a second portion of the second capping layer covers a bottom surface of the second trench;
oxidizing a sidewall of the second portion of the second capping layer and a top surface of the second portion of the second capping layer to form a second capping oxide layer;
forming a second work function metal layer over the second capping oxide layer; and
forming a second gate electrode layer over the second work function metal layer,
wherein the first capping oxide layer and the second oxide capping layer are made of a same material, and the first work function metal layer and the second work functional metal layer comprise different types of metal.

7. A method for manufacturing a semiconductor structure, comprising:
forming a first gate dielectric layer over a substrate;
forming a first capping layer over the first gate dielectric layer;
annealing the first capping layer to form a first capping oxide layer;
forming a first work function metal layer over the first capping oxide layer; and
forming a first gate electrode layer over the first work function metal layer, wherein a thickness of the first capping layer is greater than a thickness of the first capping oxide layer.

8. The method for manufacturing a semiconductor structure as claimed in claim 7, wherein the first capping layer is heated at a temperature in a range from about 600° C. to about 1000° C. to form the first capping oxide layer.

9. The method for manufacturing a semiconductor structure as claimed in claim 7, wherein the first capping layer is formed at a temperature in a range from about 200° C. to about 500° C.

10. The method for manufacturing a semiconductor structure as claimed in claim 7, wherein the first capping oxide layer has a thickness in a range from about 1 Å to about 50 Å.

11. The method for manufacturing a semiconductor structure as claimed in claim 7, wherein the first capping oxide layer is made of TiNxOy, and x:y is in a range from about 0.4 to about 1.8.

12. The method for manufacturing a semiconductor structure as claimed in claim 11, wherein the first work function metal layer is made of TiAl, TiAlN, or TaCN.

13. The method for manufacturing a semiconductor structure as claimed in claim 7, wherein a sidewall of the first capping oxide layer is surrounded by the first capping layer.

14. The method for manufacturing a semiconductor structure as claimed in claim 7, further comprising:
forming a second gate dielectric layer over the substrate;
forming a second capping layer over the second gate dielectric layer;
annealing the second capping layer to form a second capping oxide layer;
forming a second work function metal layer over the second capping oxide layer; and
forming a second gate electrode layer over the second work function metal layer,
wherein the first capping layer and the first work function metal layer are made of a same material, and the second capping layer and the second work function metal layer are made of different materials.

15. A method for manufacturing a semiconductor structure, comprising:
forming a first gate dielectric layer and a second gate dielectric layer over a substrate;
forming a first capping layer and a second capping layer over the first gate dielectric layer and the second gate dielectric layer respectively;
annealing the first capping layer and the second capping layer to form a first capping oxide layer over the first capping layer and a second capping oxide layer over the second capping layer; and
forming a first work function metal layer over the first capping oxide layer and a second work function metal layer over the second capping oxide layer,
wherein the first capping layer and the second capping layer are made of a same material, the first work function metal layer is made of a P-type metal, and the second work functional metal layer is made of a N-type metal.

16. The method for manufacturing a semiconductor structure as claimed in claim 15, wherein the first capping oxide layer and the second capping oxide layer are both made of TiNxOy, and x:y is in a range from about 0.4 to about 1.8.

17. The method for manufacturing a semiconductor structure as claimed in claim 15, wherein the first capping oxide layer is formed by oxidizing sidewalls of the first capping layer.

18. The method for manufacturing a semiconductor structure as claimed in claim 15, wherein a thickness of the first capping layer is greater than a thickness of the first capping oxide layer.

19. The method for manufacturing a semiconductor structure as claimed in claim 18, wherein a sum of the thickness of the first capping layer and the thickness of the first capping oxide layer is substantially equal to a sum of a thickness of the second capping layer and the thickness of the second capping oxide layer.

20. The method for manufacturing a semiconductor structure as claimed in claim 15, wherein the first capping layer and the first work function metal layer are made of a same material, and the second capping layer and the second work function metal layer are made of different materials.

* * * * *